United States Patent
Pollet et al.

(10) Patent No.: US 9,947,541 B2
(45) Date of Patent: Apr. 17, 2018

(54) METHOD OF FORMING SPACERS FOR A GATE OF A TRANSISTOR

(71) Applicant: COMMISSARIAT A L'ENERGIE ATOMIQUE ET AUX ENERGIES ALTERNATIVES, Paris (FR)

(72) Inventors: Olivier Pollet, Grenoble (FR); Maxime Garcia-Barros, Ivry sur Seine (FR); Nicolas Posseme, Sassenage (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/627,713

(22) Filed: Jun. 20, 2017

(65) Prior Publication Data

US 2018/0012766 A1 Jan. 11, 2018

(30) Foreign Application Priority Data

Jun. 20, 2016 (FR) ...................................... 16 55739

(51) Int. Cl.
*H01L 21/28* (2006.01)
*H01L 21/3115* (2006.01)
(Continued)

(52) U.S. Cl.
CPC ...... *H01L 21/28123* (2013.01); *H01L 21/266* (2013.01); *H01L 21/26513* (2013.01);
(Continued)

(58) Field of Classification Search
CPC ......... H01L 21/28123; H01L 21/26513; H01L 21/266
See application file for complete search history.

(56) References Cited

U.S. PATENT DOCUMENTS

2003/0017686 A1   1/2003 Wada
2010/0171180 A1*  7/2010 Zhang ............. H01L 21/823807
                                                257/369
(Continued)

OTHER PUBLICATIONS

French Preliminary Search Report dated Mar. 1, 2017 in French Application 16 55739 filed on Jun. 20, 2016 (with Written Opinion and English Translation of Categories of Cited Documents).
(Continued)

*Primary Examiner* — Errol Fernandes
(74) *Attorney, Agent, or Firm* — Oblon, McClelland, Maier & Neustadt, L.L.P.

(57) ABSTRACT

A method for forming spacers of a gate of a field effect transistor is provided, the gate including sides and a top and being located above a layer of a semiconductor material, the method including a step of forming a dielectric layer that covers the gate; after the step of forming the dielectric layer, at least one step of modifying the dielectric layer by ion implantation while retaining non-modified portions of the dielectric layer covering sides of the gate and being at least non-modified over their entire thickness; the ions having a hydrogen base and/or a helium base; at least one step of removing the modified dielectric layer using a selective etching of the dielectric layer, wherein the removing includes a wet etching with a base of a solution including hydrofluoric acid diluted to x % by weight, with x≤0.2, and having a pH less than or equal to 1.5.

16 Claims, 6 Drawing Sheets

(51) Int. Cl.
*H01L 21/311* (2006.01)
*H01L 21/762* (2006.01)
*H01L 21/265* (2006.01)
*H01L 29/78* (2006.01)
*H01L 29/66* (2006.01)
*H01L 29/06* (2006.01)
*H01L 29/08* (2006.01)
*H01L 21/266* (2006.01)

(52) U.S. Cl.
CPC ... *H01L 21/31111* (2013.01); *H01L 21/31155* (2013.01); *H01L 21/76224* (2013.01); *H01L 29/0649* (2013.01); *H01L 29/0847* (2013.01); *H01L 29/6653* (2013.01); *H01L 29/66575* (2013.01); *H01L 29/785* (2013.01); *H01L 29/7838* (2013.01)

(56) References Cited

U.S. PATENT DOCUMENTS

| | | |
|---|---|---|
| 2013/0037919 A1 | 2/2013 | Sapra et al. |
| 2014/0179107 A1 | 6/2014 | Nowling |
| 2014/0273292 A1 | 9/2014 | Posseme et al. |
| 2015/0340320 A1 | 11/2015 | Sapra et al. |
| 2016/0197160 A1* | 7/2016 | Posseme ............... H01L 21/84 438/696 |

OTHER PUBLICATIONS

D. Martin Knotter. et al., "Etching Mechanism of Silicon Nitride in HF-Based Solutions", Journal of The Electrochemical Society, 2001, 148 (3), p. F43-F46.

* cited by examiner

METHOD OF FORMING SPACERS FOR A GATE OF A TRANSISTOR

TECHNICAL FIELD OF THE INVENTION

This invention in general relates to field effect transistors (FET) and more particularly the production of gate spacers of transistors of the metal oxide semiconductor (MOSFET) type.

PRIOR ART

Figure 1A:
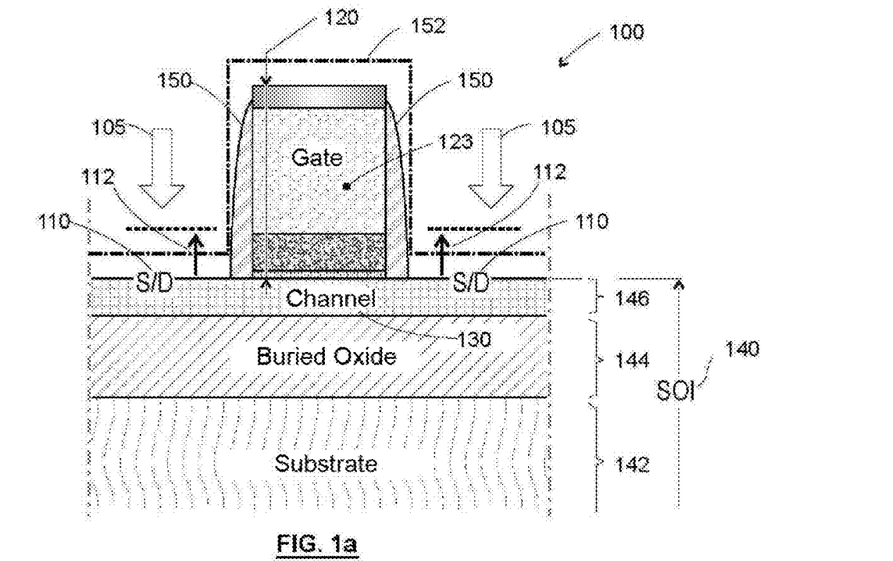
FIGS. 1a to 1d show, on the one hand, a cross-section view of an example of a MOSFET transistor of the FDSOI type in the process of production and, on the other hand, show different defects that can be observed on structures of FDSOI transistors during the etching of spacers by using one of the other of the standard methods on anisotropic etching developed by the microelectronics industry.

FIG. 1a is a cross-section view of an example of a transistor 100 in the process of production. Here are found the source and drain regions 110, globally designated as source/drain regions, since they are very generally perfectly symmetrical and can play both roles according to the electric polarizations that are applied to the transistor. The gate is conventionally comprised of a stack of layers 120 of which a large portion is most often comprised of polycrystalline silicon 123. The formation of source and drain regions is done typically by ionic implantation 105 of dopants in the regions 110, the gate 120 serving as a mask, as such preventing the doping of the region of the MOSFET transistor wherein, according to the voltages applied on the gate, will be able to develop the conduction channel 130 between source and drain.

In this example shown the substrate 140 is of the silicon-on-insulator (SOI) type. It comprises a thin superficial layer of monocrystalline silicon 146 resting on a continuous layer of silicon oxide 144, referred to as buried oxide or BOX, acronym for "buried oxide layer". The solidity and the mechanical rigidity of the whole are provided by the layer 142 which forms the body of the SOI substrate, often qualified as "bulk".

The spacers 150, typically made from silicon nitride (SiN), will allow in particular for the implementation of a technique called "Raised Source and Drain". In order to be able to maintain small electrical resistances for access to the source and drain electrodes, despite the reduction in the size of transistors, it was indeed necessary to increase their section. This is obtained via selective epitaxy of the source/drain regions 110. During this operation the initial layer of monocrystalline silicon 146 is increased 112 locally. It is then necessary to protect the gate regions in order to prevent the growth from also occurring from the polycrystalline silicon 123 of the gate. It is, among others, the role of the spacers to provide this function. They also provide a role of preserving the gate during the silicifying of the contacts (not shown) which is then carried out for the same purpose in order to decrease the series resistance of access to the electrodes of the transistor.

The formation of spacers 150 has become a crucial step in the formation of transistors that now reach dimensions that are commonly measures in nanometers (nm=$10^{-9}$ meters) and which are globally of decananometric sizes. The production of spacers is done without the intervention of any photoengraving operation. They are self-aligned on the gate 120 from the deposition of a uniform layer of silicon nitride 152 (SiN) which then undergoes a highly anisotropic etching. This etching of the SiN preferably attacks the horizontal surfaces, i.e. all of the surfaces that are parallel to the plane of the SOI substrate. It leaves in place, imperfectly, only the vertical portions of the layer 152, those that are substantially perpendicular to the place of the substrate, in order to obtain in practice the patterns 150 of which the ideal shape would often be rectangular.

With the known solutions, reducing the size of transistors makes it very delicate to obtain spacers that fully play their role as insulators and that do not induce defects in the production of transistors from SOI substrates. Indeed, it has been observed that several types of defects such as those mentioned hereinbelow appear during the etching of spacers by using one or the other of the known methods of anisotropic etching.

Figure 1B:
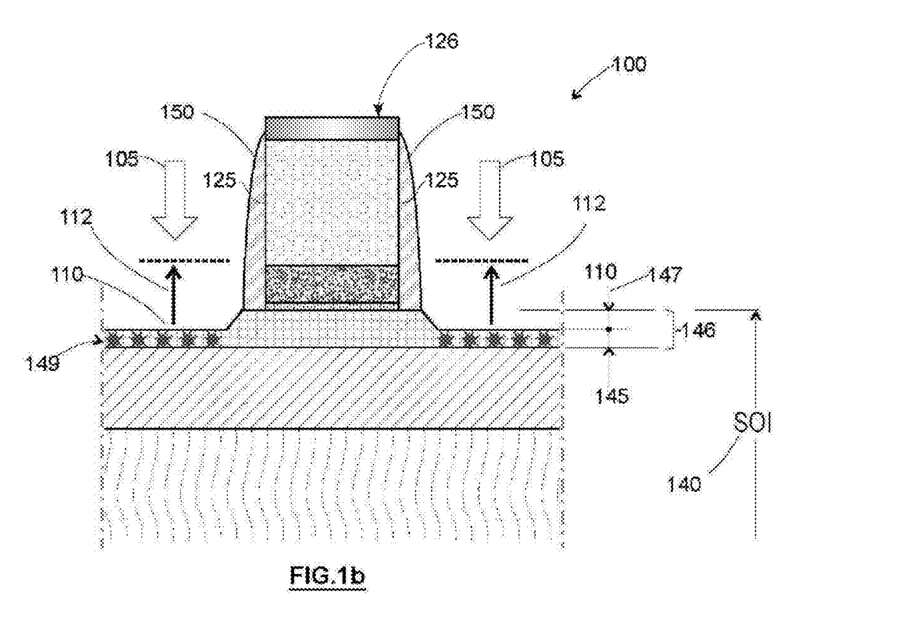
Figure 1C:
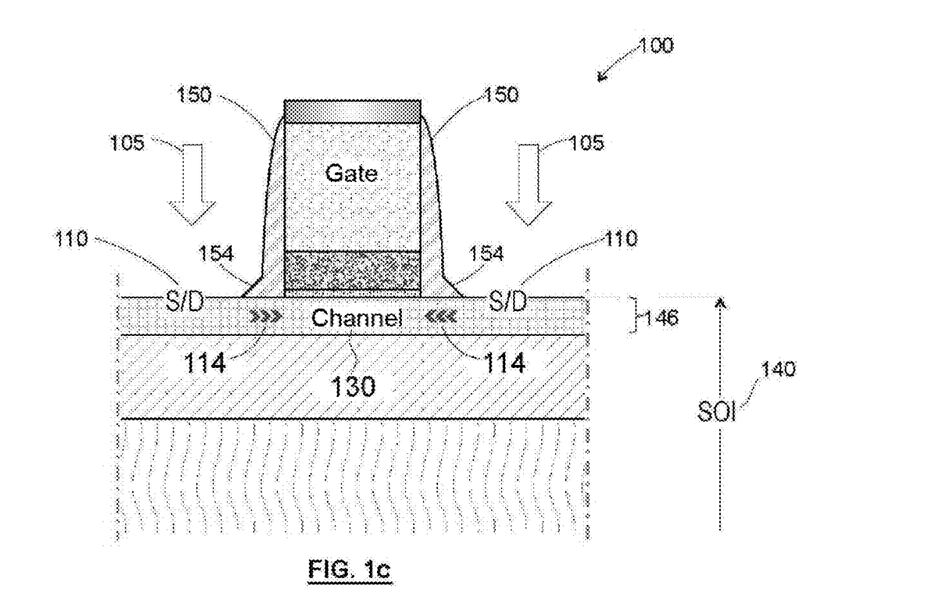
Figure 1D:
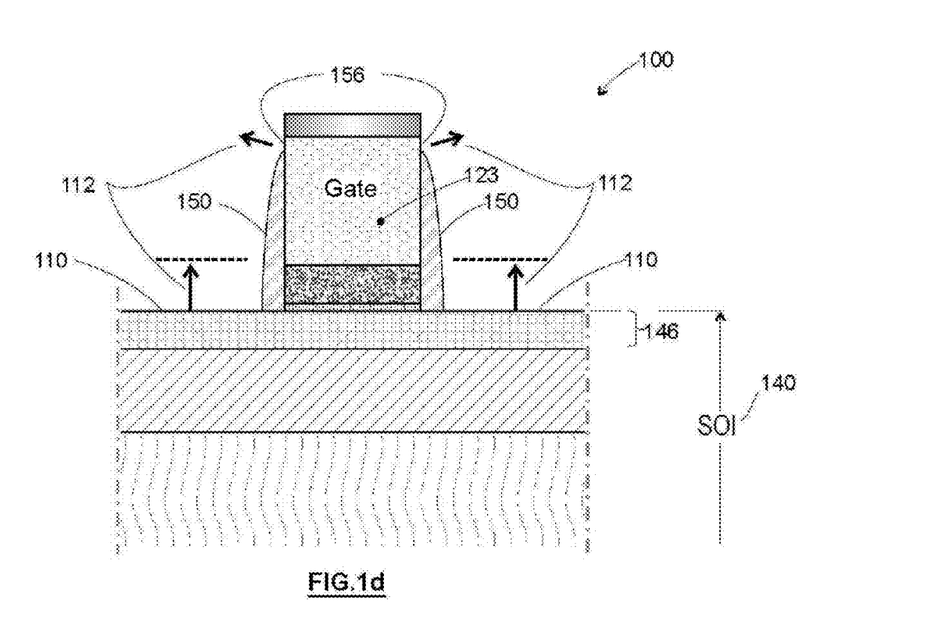

FIGS. 1b, 1c and 1d each show a type of defect observed.

Use is made in particular of a type of etching referred to as "dry" and which is implemented using a method which is most often designated by its acronym RIE, "reactive-ion etching". This is an etching method wherein is formed, in a confined enclosure, a plasma that reacts physically and chemically with the surface of the wafer to be etched. In the case of the etching of a layer of silicon nitride, which is as we have seen a usual material for the production of spacers, the reactive gas is typically methyl fluoride (CH3F) that is made to react with the material to be etched by also introducing oxygen (O2). As such an etching plasma is formed based on the chemistry of fluorine and often designated by its constituents: CH3F/O2/He.

The advantage of this type of etching is that it is rather anisotropic and makes it possible to sufficiently control the profile of the spacers 150 even if it is not possible in practice to obtain the ideal rectangular shape. The disadvantage with this type of etching is that the attack selectivity of the underlying silicon is however limited. Selectivity, i.e. the ratio of the etching speeds between the silicon nitride and the silicon is about 10 and can reach a maximum of 15 according to the formation conditions of the plasma (the nitride is etched 10 to 15 times faster than the silicon).

Etching referred to as "wet" with a phosphoric acid base (H3PO4) are also used which do not make it possible to control the profile of the spacers since the etching is primarily isotropic in this case. Note here that this type of etching is also qualified as "wet clean".

FIG. 1b shows a first problem that is in relation with the insufficient attack selectivity that exists during a dry etching of the CH3F/O2/He type between the silicon nitride and the silicon of the superficial layer 146. The result is that a significant fraction of the thin superficial layer of monocrystalline silicon 146 of the SOI substrate can then be partially consumed 147 during the anisotropic etching of the nitride. As mentioned hereinabove, the superficial layer 146 is chosen to be of low thickness in order to improve the electrical characteristics of transistors. It is typically less than 10 nm. The remaining thickness 145 can be very low. In these conditions the ion implantation 105 in order to form the source and drain regions 110 that will follow is able to be highly detrimental for the remaining monocrystalline silicon. The implantation energy of the dopants can be sufficient to provoke a complete amorphization 149 of the monocrystalline silicon which will then in particular compromise the following step of epitaxial growth 112 intended for form the raised source/drain. A growth from a layer of silicon that is partially or entirely made amorphous will create many defects on the layer formed by epitaxy.

FIG. 1c shows another problem where there is no significant consumption of the silicon of the superficial layer 146 but there is the formation of a "base" 154 at the bottom of the patterns of silicon nitride remaining on the sides of the gate after etching. The consequence is that the transition 114 of the junctions that are formed after doping by ion implantation 105 of the source and drain regions 110, with the region of the channel 130, is much less abrupt than when the spacers do not have bases as shown in the preceding figures.

The presence of bases 154 affects the electrical characteristics of transistors. Note here that the formation or not of bases at the bottom of the spacers at the consumption or not of silicon of the superficial layer of silicon 146 of the SOI substrate, described in the preceding figure, are antagonistic parameter settings of the etching which require a compromise to be found for which, ideally, bases are not formed and the superficial layer of silicon is not significantly attacked.

FIG. 1d shows a third problem that occurs when the etching produces excessive erosion of the spacers in the top portions of the gates and exposes the polycrystalline silicon 123 in these regions 156. The consequence is that the subsequent epitaxial growth 112 in order to form the raised source/drain will also occur at these locations, as well as a silicifying of parasite contacts, which risks provoking short circuits among electrodes. Indeed, the etching of the spacers requires that the etching time be adjusted in order to etch, for example, 150% of the thickness of nitride deposited. That is to say that an overetching of 50% is practiced in this example in order to take into account the non-uniformity of the deposition, or of the etching operation itself, on a wafer. As such, in certain portions of the wafer it can be observed that there is an overetching that is too pronounced that exposes the regions of the gate 156. This type of defect is also qualified as "faceting".

Other solutions have been proposed in documents US2014/0273292 and, FR12/62962. These solutions provide for a step of modification by implantation of a layer of silicon nitride in order to modify on either side of the gate, followed by a step of removing the modified layer of silicon nitride.

In the solution FR12/62962 the step of removing the modified nitride layer can be carried out by a wet clean with hydrofluoric acid (HF). The disadvantage is that the wet clean with an HF base does not allow for a selective removal of the modified nitride layer with respect to the non-modified layer of nitride. The selectivity at the non-modified nitride layer is, for example, 7 (for a concentration of HF of 1%).

Moreover hydrofluoric acid is a chemical compound of which one of the main properties is etching silicon oxide, therefore this method is intrinsically non-selective to the layer of silicon oxide forming the hard mask as well as the STI (shallow trench isolation). The selectivity of this layer of oxide to the HF is, for example, 1 (for a concentration of HF of 1%).

This invention has for purpose to propose a method for forming spacers that would suppress or limit as least some of the defects in the production of transistors, such as the consumption or the alteration of the semiconductor material (i.e. Si, SiGe) from the underlying active layer to the layer to be etched, the formation of "bases" at the bottom of the patterns on the sides of the gate of a transistor, the consumption of a hard mask or of a trench isolation with an oxide base.

The other objects, features and advantages of the present invention will be clear after an examination of the following description and the accompanying drawings. It is understood that other advantages could be incorporated.

SUMMARY OF THE INVENTION

In order to achieve this objective, an aspect of this invention related to a method for forming spacers of a gate of a field effect transistor, the gate comprising side and a top and being located above a layer made of a semiconductor material, the method comprising a step of forming a dielectric layer that covers the gate of the transistor, the method comprising:

after the step of forming the dielectric layer, at least one step of modifying said dielectric layer by ion implantation at least in portions of the dielectric layer that are located on a top of the gate and on either side of the gate and which are perpendicular to the sides of the gate by retaining portions of the dielectric layer covering the sides of the non-modified or non-modified gate over their entire thickness; the ions being ions with a hydrogen (H) base and/or with a helium (He) base;

at least one step of removing the modified dielectric layer using a selective etching of said modified dielectric layer with regards to the layer made from a semiconductor material and with regards to the non-modified dielectric layer.

The dielectric layer is a material taken from: a silicon nitride (SixNy such as SiN), SIC, SiCN, SiCBN and the step of removing the modified dielectric layer comprises a wet etching with a base of a solution comprising hydrofluoric acid (HF) diluted to x % by weight, with x≤0.2 and having a pH less than or equal to 1.5.

It is shown that with these conditions for removal, in particular the association between this specific acidity of the solution and this specific dilution of HF, the modified dielectric layer is etched in a manner that is particularly selective with regards to the layer made of a semiconductor material and with regards to the non-modified dielectric layer. As such, the consumption of the alteration of the semiconductor material is prevented or at the very least is reduced (i.e. Si, SiGe) from the underlying active layer to the layer to be etched, and the formation of "bases" at the bottom of the patterns on the sides of the gate of a transistor.

Moreover, in a particularly surprising manner this etching makes it possible to very significantly increase the selectivity of the etching of the modified dielectric layer with regards to materials with a silicon oxide base, designated generally as SiOy in this patent application, with y an integer greater than or equal to 1.

This improved selectivity is very advantageous since very often a hard mask on the top of the gate or a insulation trench, with a SiOy base, are present during the step of etching.

It follows that the hard mask or the insulation trench are not altered by the etching of the spacers. They can therefore fully play their roles.

Usually pH as acidic are not used as they are of no interest in the framework of conventional etching, of SiOy such as SiO2.

The usual approach of those skilled in the art would have led to increasing the pH with the purpose of improving the selectivity and for a given concentration of HF. In any case those skilled in the art would not have found any incentive to: both lower the pH until a value less than or equal to 1.5 and to dilute the HF to a dilution less than or equal to 0.2. They would not have been able to foresee this surprising result provided by the invention.

However, this surprising advantaged procured by the invention resides indeed in this specific combination of this pH and of this dilution.

For example, with the method according to the invention, a selectivity of the etching with respect to the silicon dioxide is obtained such that for a thickness e1 of etched modified nitride, at the same time only a thickness e1/33.7 of silicon dioxide is etched.

As such, the invention makes it possible to obtain spacers with a dielectric material base while still reducing or even eliminating at least some of the problems of the known solutions and mentioned hereinabove.

Optionally, the method can further have at least any one of the characteristics and steps hereinbelow.

The solution used during the step of removing is obtained by mixing a solution of diluted HF and a component that makes it possible to reduce the pH of the HF solution. This component is for example HCl. Alternatively is can be $H_2SO_4$ (sulfuric acid), $HNO_3$ (nitric acid). This list is not exhaustive, any acid that does not generate any species that can etch one of the materials considered could be suitable in the framework of the invention.

The solution can be obtained by mixing only a solution of HF diluted in water H2O and HCl. Alternatively it can also contain $H_2SO_4$, or $HNO_3$.

The solution could also be prepared using concentrated HF diluted in water H2O with the adding of HCl or H2SO4 or HNO3.

According to an embodiment, the pH is less than or equal to 1.3, preferably less than or equal to 1. According to an embodiment, the pH is strictly less than 1.

According to an embodiment, the percentage of HF is between 0.02% and 0.2% by weight. According to an embodiment, the percentage of HCl is between 0.3% to 3% by weight.

According to an embodiment, x≤0.15, preferably x≤0.1. According to an embodiment is substantially equal to 0.1. According to an embodiment x<0.1.

According to an embodiment, the selective etching of said modified dielectric layer with regards to the non-modified dielectric layer has a selectivity greater than or equal to 11.

According to an embodiment, the method comprises, before the step of removing a step of forming a mask (124) located at the top of the gate, said mask being made from a silicon oxide SiOy base with y being an integer greater than or equal to 1, and preferably with a base of silicon dioxide (SiO2).

According to an embodiment, the method comprises, before the step of removing a step of forming an insulation trench that extends through the layer made of a semiconductor material, said insulation trench being made from a silicon oxide SiOy base with y being an integer greater than or equal to 1, and preferably with a base of silicon dioxide (SiO2).

According to an embodiment, the selective etching of said modified dielectric layer with regards to the silicon oxide SiOy has a selectivity greater than or equal to 33.

According to an embodiment, the dielectric layer is formed of one or several dielectric materials of which the dielectric constant k is less than or equal to 7.

According to an embodiment, the method comprises a single step of modification carried out in such a way as to modify the dielectric layer throughout its thickness over all of the surfaces parallel to the plane of a substrate whereon rests the gate and so as to not modify the dielectric layer throughout its thickness on the surfaces perpendicular to this plane.

According to an embodiment, the layer made of a semiconductor material is taken from: silicon (Si), germanium (Ge), silicon germanium (SiGe).

According to an embodiment, the step of modifying said dielectric layer by ion implantation comprises the putting into contact of the dielectric layer with a plasma creating an anisotropic ion implantation according to a favored direction parallel to the sides of the gate.

According to an embodiment, the conditions of the plasma, in particular the energy of the ions and the implanted dose are chosen in such a way as to modify, by ion implantation at least in portions of the dielectric layer that are located on a top of the gate and on either side of the gate and which are perpendicular to the sides of the gate by retaining portions of the dielectric layer covering the sides of the non-modified or non-modified gate over their entire thickness.

Alternatively, the step of modifying the dielectric layer by ion implantation comprises an anisotropic ion implantation according to a favored direction parallel to the sides of the gate, with the implantation being carried out by an implanter.

According to an embodiment, the ions are with a hydrogen (H) base and/or with a helium (He) base. According to an embodiment, the plasma is obtained by injection into a reactor of gas in particular taken from helium (He) and/or hydrogen (H2) and/or ammonia (NH3). According to an embodiment, the plasma is obtained by injection into a reactor of gas in particular taken from helium (He), hydrogen (H2) and ammonia (NH3) with the injection flow rate of these gases being respectively from 50 to 500 sccm, 10 to 500 sccm, 10 to 500 sccm.

According to an embodiment, the ions are with a hydrogen base and are taken from: H, H+, H2+, H3+.

According to an embodiment, the step of modifying the dielectric layer is carried out with a polarization power or source power ranging from 20V (volt) to 500V, with a pressure ranging from 5 mTorr (milliTorr) to 100 mTorr, at a temperature ranging 10° C. to 100° C., for a duration of a few seconds to several hundred seconds.

According to an embodiment, the step of modifying the dielectric layer carried out using a plasma modifies the dielectric layer continuously from the surface of the dielectric layer and over a thickness between 1 nm (nanometer) and 30 nm, preferably between 1 nm and 10 nm.

According to an embodiment, the insulating layer is arranged in contact with the layer made of a semiconductor material, forming the conduction channel. Preferably, the layer is arranged in contact with the layer. Preferably, the layer is arranged directly in contact with the gate oxide formed by the layer, if the layer is absent or is deposited directly in contact with the layer. Preferably, the dielectric layer is deposited directly in contact with the layer on the sides of the gate. Preferably, the dielectric layer is deposited directly in contact with the layer made of a semiconductor material intended to form the conduction channel.

According to an embodiment, the transistor is a transistor of the FDSOI type of of the FinFET type.

BRIEF DESCRIPTION OF THE DRAWINGS

The goals, objects, features and advantages of the invention will be better understood from the detailed description of an embodiment of the latter that is illustrated by the following accompanying drawings in which.

The attached drawings are given as examples and are not limiting to the invention. These drawings are diagrammatical representations and are not necessarily to scale of the practical application. In particular, the relative thicknesses of the layers and of the substrates may not be representative of reality.

DETAILED DESCRIPTION OF THE INVENTION

It is specified that in the context of the present invention, the terms "on", "is on top of" or "underlying" and the equivalents thereto do not necessarily mean "in contact with." Thus, for example, the deposition of a first layer on a second layer does not necessarily mean that the two layers are directly in contact with each other, but this means that the first layer at least partly covers the second layer while either being directly in contact with it or being separated from it by another layer or another element.

In the following description, the thicknesses are generally measured according to directions perpendicular to the plane of the lower face of the layer to be etched or of a substrate whereon the lower layer is arranged. As such, the thicknesses are generally taken according to a vertical direction in the figures shown. On the other hand the thickness of a layer that covers a side of a pattern is taken according to a direction perpendicular to this side.

In the following description, a solution of HF diluted to x % corresponds to a mass concentration. A solution of HF diluted to x % means that the mass of the HF represents x % of the total mass of the solution. Note, as details shall be provided in what follows, that the adding of the preferably strong acid such as HCl in the initial solution (i.e. after dilution of the HF but before adding the acid), does not significantly modify or modifies only very little the mass % of HF. As such, the mass % of HF varies very little between the initial solution and the final solution (i.e. after adding the acid).

FIGS. 2a to 2d describe the steps of a detailed example of a method according to the invention applied to the production of transistors for example of the FDSOI type without this type of transistor being a limitation.

Figure 2A:
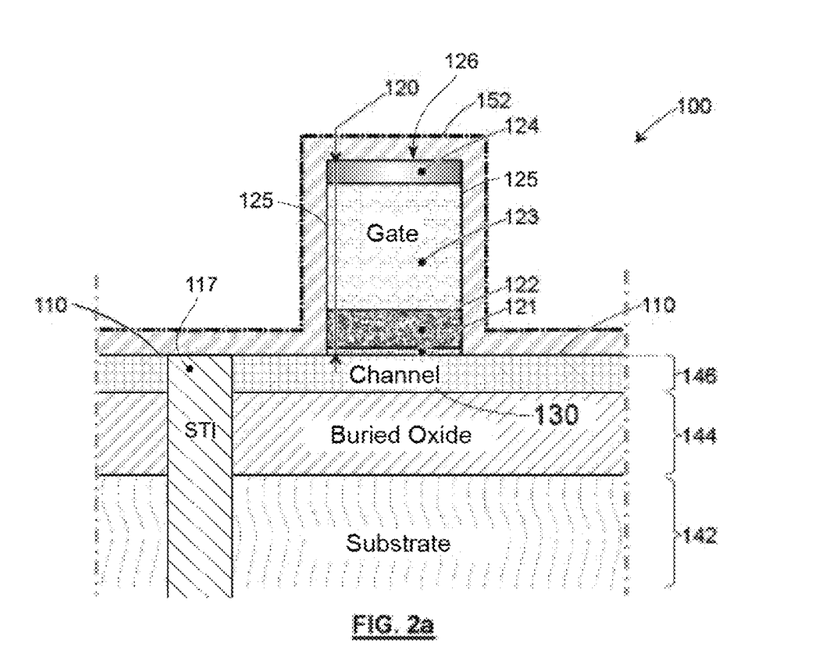
FIGS. 2a to 2d show the steps of an example of the method according to the invention applied to the production of transistors.

In transistors of the FDSOI type, the superficial layer of monocrystalline silicon 146 can be controlled precisely in thickness and in doping. In particular, it is advantageous for the performance of transistors that the channel 130 be entirely depleted of carriers, i.e. "fully depleted" (FD) according to the term that is generally used to designate this state. This can be obtained by producing the transistors using SOI substrates of which the superficial layer 146 is very thin.

The principles of the following steps can also apply to the formation of spacers on the sides 125 of a gate 120 of another type of transistor.

FIG. 2a shows the step of deposition of a dielectric layer 152, of a preferably substantially uniform thickness, over all of the surfaces, vertical and horizontal, of the devices being manufactured. This step, is done preferably using a deposition method called LPCVD (low pressure chemical vapor deposition). This type of deposition that is practices under atmospheric pressure allows indeed a uniform deposition over all of the surfaces regardless of their orientation.

Although not necessary for the understanding of the invention, note that the gate electrode is in this example comprised, at this stage, of the method of several layers for certain types of transistors. In addition to the layer of polycrystalline or monocrystalline silicon 123, there is, in the stack of layers that form the gate 120, first of all the thin insulating layer of gate oxide 121 through which an electric field will be able to develop in order to create the underlying conduction channel 130 between source and drain, when sufficient electrical voltage is applied on the gate. In the most recent MOSFET transistors, a technology is implemented qualified as "high-k/metal gate" i.e. the insulating layer 121 is made from an insulating material with high permittivity (high-k) covered by a metal gate represented by the layer 122. This technology was developed in particular to reduce the leakage currents through the gate that were becoming too substantial due to the decrease in the thickness of the insulating layer 121 to atomic dimensions. At this stage, the stack of layers of the gate also comprises a hard protective mask 124 that will be removed later in order to allow for contact to resume on this electrode. This hard mask, that remains n place after etching of the gate, is typically made of silicon oxide (SiOy) with y being an integer greater than or equal to 1 and most often made of silicon dioxide SiO2. Its role is to protect the top 126 of the gate from any damage during the etching of the spacers.

Also provided is the formation of insulation trenches 117 of which the function is to electrically insulate the regions of the active layer 146 made of a semiconductor material. An insulation trench 117 is formed from a dielectric material that passes through the active layer 146 in order to extend to the insulating layer for example made of buried oxide 144. Often the insulation trench extends so as to pass through the entire insulating layer 144 until it reaches the support substrate 142. The insulation trench 117 for this type of transistors is often qualified as STI (shallow trench isolation).

According to an embodiment, the dielectric layer 152 has a nitride base. According to an embodiment, the dielectric layer 152 of nitride has a thickness between 5 and 20 nm, and typically about 10 nm. As an example, the dielectric layer 152 has a silicon nitride (SiN) base. The dielectric layer 152 can also be chosen from silicon carbide (SiC), silicon carbonitride (SiCN), boron and silicon carbonitride (SiCBN).

According to another embodiment, the dielectric layer 152 comprises a dielectric layer with a low permittivity $\in$ (the permittivity is noted as epsilon) or with a low dielectric constant k, with preferably k less than or equal to 7. As such, this invention is not limited to a dielectric layer formed with a nitride base. This invention is not, moreover, limited to a dielectric layer of silicon nitride (SiN).

This invention extends advantageously to any spacer that comprises a dielectric material with low permittivity $\in$ (referred to as "low-k"). The term "permittivity of the material" means, on a microscopic level, the electrical polarizability of the molecules or atoms that form said material. The permittivity of a material is a tensor magnitude (the response of the material can depend on the orientation of the crystallographic axes of the material), which is reduced to a scalar in isotropic mediums. The dielectric constant is noted as k in the field of integrated circuits and semiconductors, for example. So-called "low-k" materials are dielectrics with a low permittivity. They are used as insulators between the metal interconnections in order to decrease the coupling between the latter.

In an embodiment, the dielectric layer 152 has or comprises a material that has a dielectric constant less than 7, preferably 4 and preferably less than 3.1 and preferably less than or equal to 2, which as such makes it possible to reduce the parasite capacity in order to possibly improve the performance of the transistor. For example, as indicated hereinabove the material of the dielectric layer 152 is taken from: SiC, SiCN, SiCBN. This makes it possible to reduce the parasite capacity and to consequently improve the performance of the transistor.

Preferably but only optionally, the method of the invention comprises an optional step of reducing the dielectric constant of the dielectric layer 152. According to an advantageous embodiment, the reduction in the dielectric constant is obtained during the step of deposition of the dielectric layer 152.

According to an embodiment, the reduction in the dielectric constant comprises the introduction in the dielectric layer 152 in formation of precursors that form connections that reduce a polarizability of the dielectric layer 152. These precursors are chosen in such a way as to generate connections that are less polar than silicon nitride, such as Si—F, SiOF, Si—O, C—C, C—H, and Si—CH3.

According to another embodiment, alternative or combinable with the preceding one, the reduction in the dielectric constant comprises the introduction into the dielectric layer 152 in formation of a porosity.

Figure 2B:
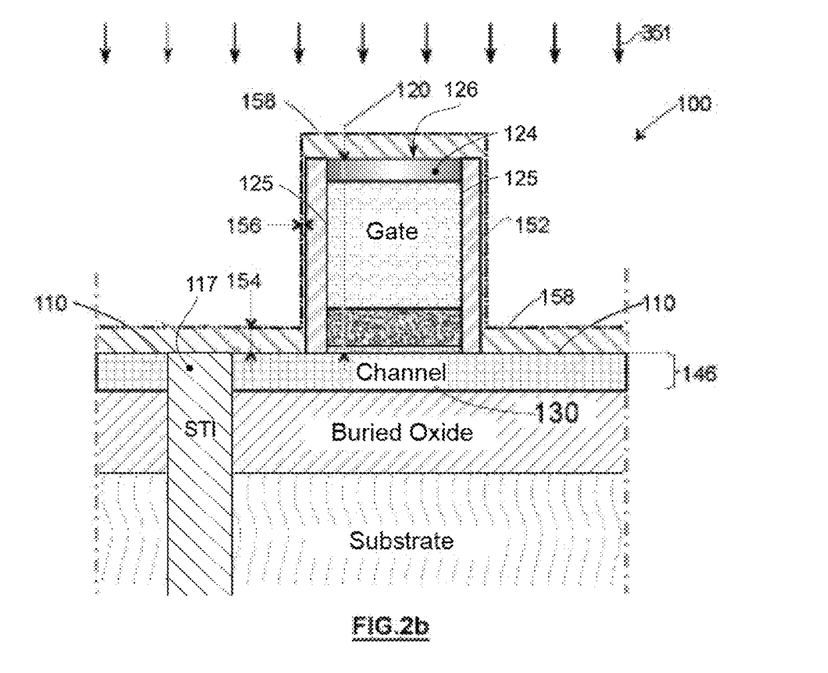

FIG. 2*b* shows the following step of the invention wherein we proceed directly with a modification 430 of the dielectric layer 152 that has just been deposited. Optionally, this operation may have been preceded by a "main" etching 420, for example a conventional dry etching of the CH3F/O2/He type.

The step of modifying 430 the dielectric layer 152 such as deposited, or of the layer remaining after a first conventional etching, is done via implantation 351 of light species also designated as light ions. In the framework of this invention, these ions are with a hydrogen (H) base and/or with a helium (He) base.

The ions with a hydrogen (H) base are for example taken from: H, H+, H2+, H3+.

Advantageously, these species can be taken alone or in combination. For example, the possible chemistries for the implantation are: H, He, NH3, He/H2, He/NH3. These ions can be implanted in a material to be etched, without provoking the dislocation of its atomic structure such as would result in a pulverization of the latter.

"Light ions" means ions coming from materials of which the atomic number in the periodic table of the elements is low. Generally ail of the elements that can be implanted in the material to be etched, without provoking any dislocation of its atomic structure such as would result in a pulverization of the latter, and of which without re-deposition of the material etched on the walls of the reactor or the patterns being etched themselves, can be suitable.

Particularly advantageously, the implantation of light species is favored by the incorporation in the plasma of a component that allows for the dissociation of the light ions and therefore the increase in the density of the light ions in the plasma and the increase in the implanted dose.

Advantageously, the implantation parameters, in particular the energy imparted on the ions, the time and the implantation dose are chosen in such a way that the modified dielectric layer 158 can be etched selectively with respect to the layer 146 made of a semiconductor material.

Advantageously, these parameters are also set in such a way that the modified dielectric layer 158 can be selectively etched with respect to the non-modified portion of the dielectric layer 152.

Advantageously, these parameters are also set in such a way that the modified dielectric layer 158 can be selectively etched with respect to a layer made of oxide typically an oxide of said semiconductor material, with the latter forming for example a layer of gate oxide, a hard mask 124 or a insulation trench 117. Typically, the etching is selective of the modified dielectric material by hydrogen implantation with respect to the silicon oxide SiOy.

The implantation is carried out, according to a non-limiting example of the invention, in a plasma with a gaseous hydrogen (H2) base. More generally, all of the gaseous components, that can by dissociation release the light ions mentioned hereinabove, can be used in the plasma. Note here that this step of modifying 430 the dielectric layer 152 to be etched can be practiced in many different ways by adapting all sorts of means currently used by the microelectronics industry. Use is made in particular of standard etching reactors in which can be realized plasmas with a low or high density and wherein it is possible to control the energy of the ions in order to allow for the implantation of the light species hereinabove intended to modify the layer to be etched. It is also possible to use a type of plasma referred to as immersion that is commonly used to practice an implantation of species on the surface of a device in the process of manufacture.

Finally, the implantation can also be carried out in a standard implanter wherein the ions are accelerated in an electric field in order to obtain their implantation in a solid.

The modification operation is advantageously highly anisotropic for the realization of spacers on the sides 125 of the gates due to the directionality of the ions of the plasma or of the implanter. It therefore preferably affects the horizontal surfaces, i.e. all of the surfaces that are parallel to the plane of the substrate 142. The modified thickness of the horizontal surfaces 154 is as such clearly more substantial than on the vertical surfaces 156 i.e. on all of the surfaces perpendicular to the plane of the elaborated substrate 146, whereon the gate is deposited. Advantageously, the implantation according to this invention makes it possible to not attack the vertical surfaces. As such, according to a preferred embodiment, the modified thickness on the vertical surfaces 156 is practically zero, preferably from about 1 to 3 nanometers.

This plane is perpendicular to the plane of the cross-section shown in FIGS. 2*a* to 2*d*. The elaborated substrate 142 preferably forms a wafter with two parallel faces. It (has for example the shape of a disk, a square, a polygon, etc. The thin layer 146, the buried oxide layer 144 and the bulk substrate 142 are arranged according to parallel planes. As such, a surface will be qualified as horizontal if it is parallel to the plane of the layer or of the layers forming the substrate 146, whereon is formed the gate and a surface will be qualified as vertical if it is perpendicular to this same plane.

Typically, a thickness 154 of 10 nm on the horizontal surfaces can be modified during this operation. A thickness 156 of the layer 152 ranging from 1 to 3 nm is however also modified on the vertical surfaces regardless of the conditions of the plasma. These vertical surfaces with respect to the plane of the substrate 146 are therefore parallel to the side 125 of the gate. The modified thicknesses depend on the conditions of implementation, in particular on the means used (plasma or implanter) and also on the fact that it is desired to obtain the etching of the spacers in a single global step of modifying and etching or on the contrary these operations are repeated until full etching is obtained.

As such, according to the particular implementations of the method of the invention and of the initial thickness of the dielectric layer 152, the step of modifying this layer can affect all of this layer where, as shown in the example of FIG. 2b, only a portion of the latter. In this particular case, the material is modified over its entire thickness but only on the horizontal regions v154. In this case, the step of modifying 430 and the following step of removing 440 the modified layer described hereinafter can be repeated until the full removal of the dielectric material of the modified dielectric layer 158 over all of the horizontal surfaces.

The implantation by plasma has the advantage of allowing for an implantation continuously in a volume extending from the surface of the implanted layer. Furthermore, using a plasma allows for an implantation at shallower depths than the minimum depths that can be obtained with implanters. As such, an implantation via plasma makes it possible to effective and relatively homogeneously implant or at the very least continuously thin thicknesses which then be removed via selective etching. This continuity of implantation from the implanted face makes it possible to improve the homogeneity of the modification according to the depth, which results in a constant etching speed over time of the implanted layer. Moreover, the increase in the selectivity conferred by the implantation with respect to the other layers is effective at the start of the etching of the implanted layer. Implanting via plasma as such allows for significantly improved control of the etching precision.

Plasma implantation typically makes it possible to implant then to remove thicknesses extending from the surface of the of the implanted layer and on a depth ranging from 0 nm to 100 nm. Conventional implanters, allow for an implantation in a volume between 30 nm and several hundred nanometers. On the other hand, conventional planters do not make it possible to implant the species between the surface of the layer to be implanted and a depth of 30 nm. It was observed that implanters did not then make it possible to obtain a sufficiently constant etching speed of the modified layer and this from the surface of the latter, as such leasing to less etching precision compared to what the invention makes possible.

Using a plasma for modifying the layer to be removed is therefore particularly advantageous in the framework of the invention that aims to remove a thin thickness of a dielectric layer 152, typically between 1 and 10 nm and more generally between 1 and 30 nm.

The step of modifying carried out using a plasma modifies the dielectric layer 152 continuously from the surface of the dielectric layer 152 and over a thickness between 1 nm and 30 nm and preferably between 1 nm and 10 nm.

Preferably, the modification of the dielectric layer 158 retains a thickness of non-modified dielectric 152 on the sides 125 of the gate. This thickness is retained, at least partially, during the selective etching. It then defines gate spacers 150.

Preferably, the implantation parameters, in particular the implantation energy of the light ions and the dose implanted, are provided in such a way that the modified dielectric layer 158 can be selectively etched with regards to the material of the layer 146 made of a semiconductor material and with regards to the non-modified dielectric layer 152.

Preferably, a single step of modification is carried out in such a way as to modify the dielectric layer 152 throughout its thickness over all of the surfaces parallel to the plane of a substrate whereon rests the gate and so as to not modify the dielectric layer 152 throughout its thickness on the surfaces parallel to the favored direction of implantation.

Preferably, the implantation modifies the dielectric layer 152 in an uninterrupted manner from the service.

According to a particular embodiment, the method comprises a single step of modification 430 carried out in such a way as to modify the dielectric layer 152 throughout its thickness over all of the surfaces parallel to the plane of a substrate whereon rests the gate and so as to not modify the dielectric layer 152 throughout its thickness on the surfaces perpendicular to this plane. These surfaces perpendicular to this plane, i.e. perpendicular to the layer 146 made of a semiconductor material forming a conduction channel to the bulk substrate are typically parallel to the sides 125 of the gate of the transistor. As such, following this single step of modification 430, a removal 440 that will be described in what follows as selective of the modified dielectric layer 158 makes it possible to remove the dielectric layer over all of the except those parallel to the sides 125 of the gate.

According to another embodiment, the method comprises several sequences each comprising a step of modification 430 and a step of removing 440. During at least one of the steps of modification 430, only a portion of the thickness of the dielectric layer 152 is modified. This embodiment has for advantage to remove more substantial thicknesses of material. It is as such preferable to carry out several cycles each comprising a modification then a removal. Advantageously, the sequences are repeated until disappearance of the dielectric layer 152 over all of the surfaces parallel to the plane of a substrate whereon the gate rests. Only the faces parallel to the sides 125 of the gate retain a thickness of dielectric, this thickness not being subject to modification by implantation.

According to an advantageous embodiment, the dielectric layer 152 is arranged directly in contact with the layer 146 made of a semiconductor material. Preferably the dielectric layer 152 is arranged directly in contact with the gate which is preferably formed in a semiconductor material.

Figure 2C:
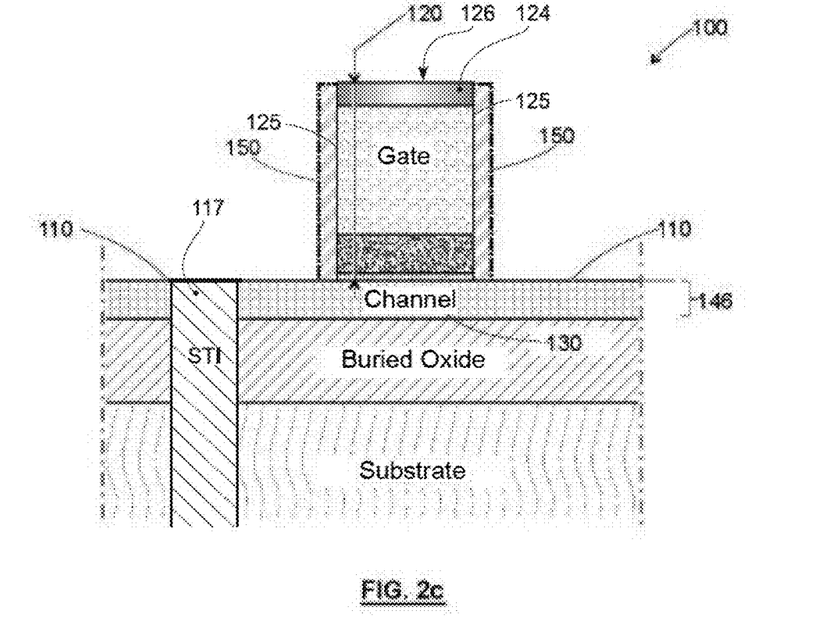

FIG. 2c shows the final result of the following step after having proceeded with the etching, i.e. with the selective removal 440 of the modified dielectric layer 158.

The selective removal comprises an etching carried out by putting into contact of the stack, in particular of the dielectric layer 152 with a solution comprising hydrofluoric acid (HF). More particularly this solution is obtained using a solution of HF diluted to x %, with x<0.2.

Advantageously, it has a pH less than 1.5.

The decrease in the pH in order to increase the acidity is for example obtained by adding hydrochloric add to the solution of HF diluted to x %.

As indicated hereinabove, the concentration of HF at x % corresponds to the mass concentration of HF in the initial solution i.e. before adding HCl. However, the volume required of HCl to lower the pH of the solution to the desired value is very low.

As a non-limiting example, 24 ml ($10^{-3}$ liters) of HCl concentrated at 36% by weight is enough to lower the pH below 1 for a solution of 3 liters of HF diluted to 0.1% by weight. Consequently the concentration of the HF passes from 0.1% to 0.0997% by weight in the final solution after adding HCl. The concentration in HCl in such a mixture is 0.3% by weight.

According to an embodiment, in the final solution, the concentrations in HF and in HCl are the following: HF 0.098% and HCl 0.7%.

The usable ranges are preferably: HF from 0.02% to 0.2% by weight, HCl from 0.3% to 3% by weight.

This specific solution with a HF base makes it possible to etch the modified dielectric layer 158 selectively with respect to the layer 146 made of a semiconductor material and with respect to the non-modified dielectric level 152.

Particularly advantageously, and contrary to the solutions of HF diluted to 1% and of which the pH is close to 2.5, the HF solution according to the invention makes it possible to etch the modified dielectric layer 158 very selectively with regards to the oxide layers. As such the hard mask 124 or the insulation trench 117 made of oxide, for example of silicon dioxide SiO2 are not altered by the etching.

The following table gives an example of the thicknesses (in nanometers $10^{-9}$ meters) consumed after a period of 600 seconds by a solution of HF diluted to 0.1% and that has a pH of 0.93:

| pH of the Bath | nature of the layer | Consumption (nm) |
|---|---|---|
| 0.93 | oxide | 0.3 |
|  | SiN | 0.9 |
|  | SiN modified by implantation | 10.1 |

As a comparison, the following table gives an example of the thicknesses consumed after a period of 600 seconds by a solution of HF diluted to 0.1% and that has a pH of 2.43:

| pH of the bath | nature of the layer | Consumption (nm) |
|---|---|---|
| 2.43 | oxide | 2.8 |
|  | SiN | 1.1 |
|  | SiN modified by implantation | 11.5 |

As such, the selectivity (ratio of the etching speeds) of the etching of the modified SiN with respect to the non-modified SiN is 11.2.

In an even more marked way, the selectivity of the etching of the modified SiN with respect to the SiO2 is 33.7. This makes it possible to very precisely control the etching of the modified portions 158 of the dielectric layer 152 with respect to the silicon oxide layers such as the insulation trench 117, the hard mask 124 and the gate oxide for example.

For comparison, the selectivities of the etching of the modified SiN with respect to the non-modified SiN and the SiO2 are respectively 10.5 and 4.1 for a solution of HF diluted to 0.1% and that has a pH of 2.43:

The putting into contact is carried out preferably by immersing the stack comprising the dielectric layer 152 in a bath of the solution with a HF base. More generally, the method could be implemented in any equipment that allows for the putting into contact of a liquid solution with a wafer. In particular, this could be done by aspersion of liquid or in immersion.

The equipment used for this step of removal can for example be any etching or wet clean equipment that accepts low pHs and in particular less than 1.7 and preferably less than 1.

Wet etching for example makes it possible to remove a thickness of the modified dielectric layer 158 between 1 nanometer and a few dozen nanometers.

The stopping of the etching is done via time. This is done preferably on the non-modified dielectric layer 152 or on the monocrystalline silicon of the layer 146 or again on the hard mask 124 at the top 126 of the gates 120 or on the top of the insulation trench 117.

At the end of this step of removal 440 there remains of the initial dielectric layer 152 only vertical patterns, primarily on the sides 125 of the stack of layers that form the gate 120. They form the gate spacers 150 of the transistor.

Figure 2D:
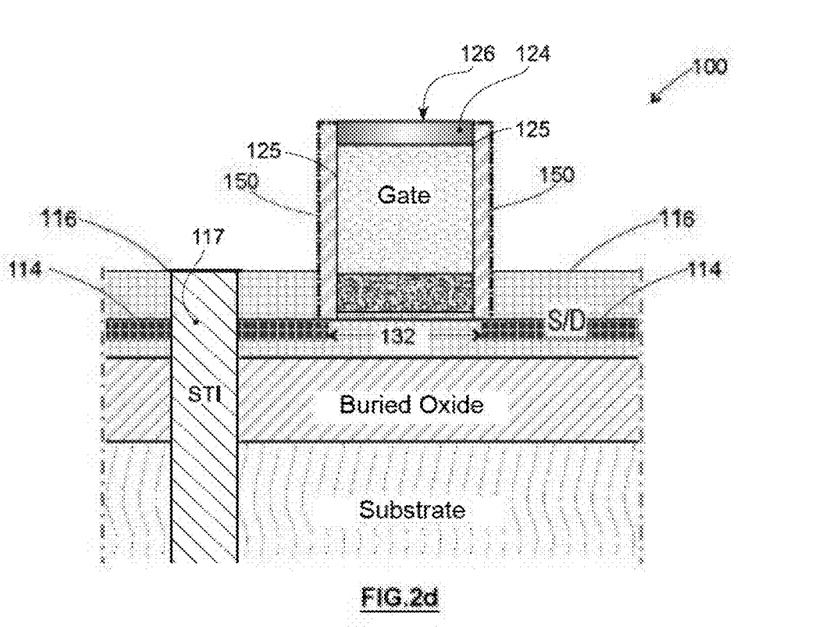

FIG. 2d shows the step 460 of forming drain and source regions of a transistor for example of the FDSOI type.

At the end of the last or only step of removing the modified dielectric layer 158, i.e. when removal has been completed on all of the horizontal surfaces, a cleaning operation is carried out referred to as "wet clean".

It is then possible to proceed with the formation 470 of the source and drain electrodes 110. As already mentioned, the doping that will delimit the source and drain and therefore the length of the channel 132 can be done via ion implantation before proceeding with an epitaxial growth on these regions in order to increase their section and decrease their resistance. If the doping is carried out before epitaxial growth, as shown in FIG. 2d, the method is said to be "extension first" in order to indicate that the extensions (of source and of drain under the spacers) are carried out first, i.e. before epitaxial growth. In the opposite case which is "extension last", we proceed directly with the step of epitaxial growth without prior doping. The doping of the source/drain regions is done only after epitaxial growth of these regions. In the case of transistors with an n-type channel (nMOS), the dopants implanted are typically arsenic (As) or phosphorus (P). For transistors with a p-type channel (pMOS) the dopants are boron (B) or boron difluoride (BF2).

The result is shown in FIG. 2d which shows the doped source/drain regions 114 before epitaxial growth of the raised source/drain regions 116.

Advantageously, the gate of the transistor is located on a stack of layers forming an elaborated substrate of the silicon-on-insulator (SOI) type. Preferably, it is deposited directly in contact with the layer forming the conduction channel. Advantageously, the use of the invention with such a SOI substrate makes it possible to preserve the integrity of the superficial layer of very low thickness that forms the conduction channel of a transistor formed from a SOI substrate.

Figure 3:
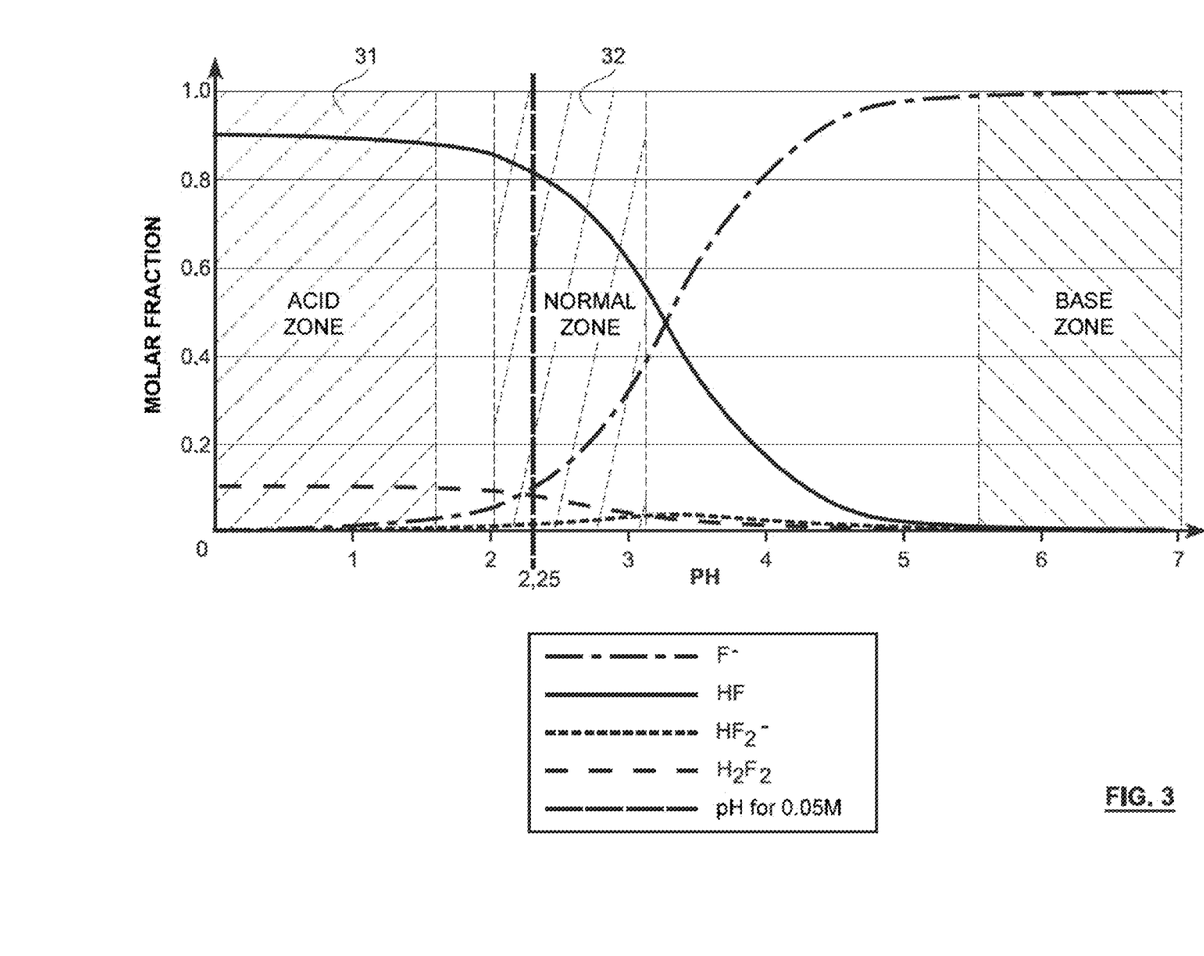
FIG. 3 shows a graph that represents the concentration in fluorinated species in the solution according to the pH of the solution.

FIG. 3 shows a graph that represents the concentration, more precisely the molar fraction, of the fluorinated species in the solution according to the pH of the solution.

It is observed on this graph that in a region 32 of which the pH is between 2 and 4, the molar concentrations in HF and in F$^-$ ions are substantial.

When HCl is added in order to increase the acidity of the solution and the pH becomes less than 1.7, the molar concentration in F$^-$ ions is very sharply reduced and the molar concentration in HF is very substantial. This can be explained by the association of the H$^+$ ions of the HCl with the F$^-$ ions in order to form molecules of HF. This appears clearly in the region 31 of the graph.

However, in the framework of the development of this invention it has been shown that these F$^-$ ions etch the modified nitride with a lesser selectivity than the molecules of HF.

Note that on this graph, the abbreviation M is an abbreviation of the International System of Units which designates a concentration in mol/L. The vertical line denoted by pH for 0.05M designates the pH of the solution of HF of a concentration 0.05M in equilibrium, i.e. if there is only the HF in solution in the water without seeking to modify the pH. Note that the molar concentration of 0.05M corresponds to the mass concentration 0.1%, the pH at equilibrium of such a solution is equal to 2.25.

Figure 4:
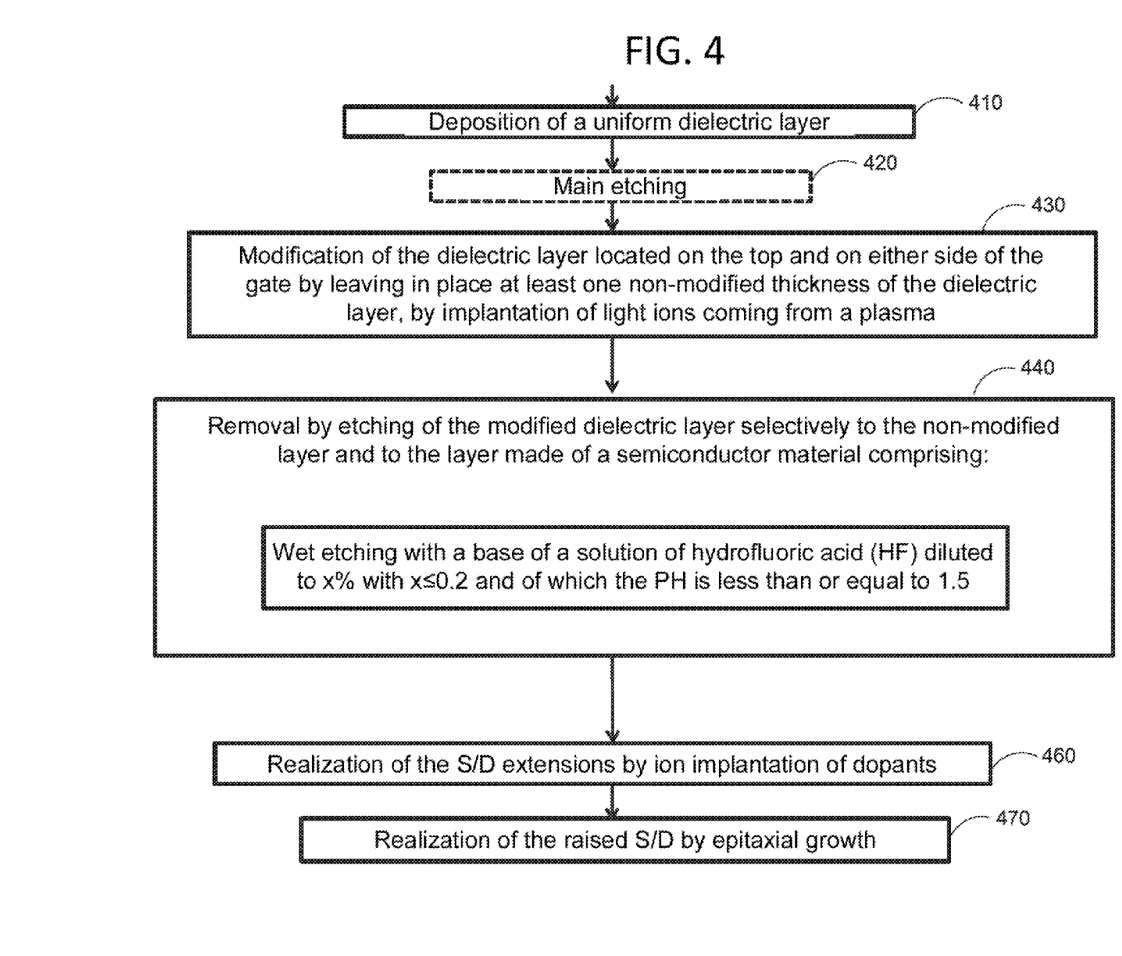
FIG. 4 summarizes the steps of an example of the method of the invention intended to form spacers and that do not or at the very least limit the defects described in FIGS. 1b to 1d.

FIG. 4 summarizes the steps of the method of the invention intended to form spacers and which induces few or none of the faults described in particular in FIGS. 1b, 1c and 1d for the producing of transistors, for example but not limited to the FDSOI type.

After the deposition 410 by LPCVD of a uniform dielectric layer 152 over all of the surfaces of the devices in the process of manufacture, the removal of said modified dielectric layer 158 is carried out on the surfaces that are not intended to form the spacers. This removal comprises several steps, of which the steps 430, 440 and optionally the prior step 420.

As such, optionally, we proceed with a "main" etching, preferably a conventional isotropic wet etching 420 of the modified dielectric layer 158. In the framework of specific implementations of the invention, it can be decided to maintain or not the step of main etching 420, the following steps then apply either on the dielectric layer 152 such as deposited or on the remaining layer after a main etching has been carried out beforehand as in the standard method of etching spacers.

As shown in FIG. 2b, the following step 430 consists in anisotropically modifying all or a portion 154 of the remaining dielectric layer 152 by implantation of light ions.

According to the applications of the method of the invention it may preferred to use a plasma etcher for the plasma implantation in particular for the following reasons: the cost of the equipment is less, the manufacturing cycle times can be very short since the step of main etching 420 and that of modifying 430 the dielectric layer 152 can then be done in the same equipment with out exposing to air the devices in the process of manufacture. Note in particular that the step of modifying 430 can be carried out in may different ways by adapting all sorts of means currently used by the microelectronics industry, such as by using any type of etcher, for example in an ICP reactor (Inductively Coupled Plasma), or in a reactor the CCP type (Capacitively Coupled Plasma) which makes it possible to control the energy of the ions. It is also possible to use a type of plasma referred to as immersion that is commonly used to practice an implantation of species on the surface of a device in the process of manufacture.

In order to choose the implantation parameter those skilled in the art, in order to determine the behavior of the material to be etched in the type of plasma etcher chosen, will probably preferably proceed with "full wafer" tests in order to establish behavior curves. They will deduce from this the implantation parameters, in particular the energy and the dose of ions, i.e. the exposure time, to be used to reach the desired thickness of the material to be modified.

The table hereinafter gives the typical conditions for implementing the step 430 of modifying the dielectric layer 152 in the case of the use of a standard plasma etching reactor. These conditions depend largely on the thickness to be modified in the dielectric layer 152. This is only a particular example of the implementation of the step 430 of modifying the layer to be etched.

The possibility of pulsing the source and or the bias also makes it possible to have better control on the implantation depth for low thicknesses.

| Etching reactor: | The values hereinbelow apply more particularly to the type of ICP etcher although any type of wet etching device can potentially be used. |
|---|---|
| Modified thickness: | from 1 nanometer to a few dozen nanometers, typically 10 nanometers. |
| Chemistry | based on a hydrogen-based and/or helium-based chemistry such as H2, NH3 or a combination of helium and hydrogen, or of helium and NH3. |
| Flow rate comprising: | |
| —H2 | 10 sccm-500 sccm (cubic centimeters per minute) |
| —He | 50 sccm-500 sccm |
| —NH3 | 10 sccm-500 sccm |
| Power of the source: | 0-2000 W |
| Polarization voltage: | 20 V-500 V |
| Frequency | 100 Hz-500 kHz (for pulsed mode) |
| Operating cycle | 10%-90% (for the pulsed mode) |
| Pressure: | 5 milli-100 milli Torr |
| Temperature: | 10° C.-100° C. |
| Time: | a few seconds to a few hundred seconds |

The following step 440 is that where the removing via etching of the modified is carried out or at the least the modified thickness of the modified dielectric layer 158. In order to avoid the problems of the conventional methods of etching of spacers described in FIGS. 1b to 1d, it is necessary that the etching of the modified dielectric layer 158 is as selective as possible with respect to the silicon in particular so as to not attack the monocrystalline silicon of the source/drain regions with the disadvantages and consequences described hereinabove.

The removal 440 of the modified dielectric layer 158 comprises the wet etching with a base of a solution comprising HF and of which the pH is less than 1.7.

The thickness of the modified dielectric layer 158 is typically comprised in a range of values ranging from 1 nanometer to a few dozen nanometers. The etching time can ranger from a few seconds to a few minutes. They obviously directly depend on the dielectric layer which was modified 158.

The following steps 460, 470 of the method are not different from those corresponding to standard methods where it is possible to carry out the extensions of the source/drain regions 460 by ion implantation of dopants before epitaxial growth of the raised source/drain 470 of transistors for example of the FDSOI type.

Detailed Non-Limiting Example

As a non-limiting example of the invention, a layer of silicon nitride (SiN) of 15 nm is deposited intended to form a spacer 125.

In order to modify a thickness of 12 nm of silicon nitride in an etcher of the ICP type (TCP RF), continuously, a voltage of tension 250V (polarization voltage) is applied for a duration of 60 seconds for a plasma formed from a component with a hydrogen (H) base of which the flow rate is 48 sccm. In this case, the pressure used is 10 mTorr and the power of the source 500 W.

For example in order to remove 10 nm of modified SiN, the latter is exposed to a solution of HF diluted to 0.1% of which the pH is 0.93 for 12 minutes (720 seconds).

In light of the preceding description, it clearly results in that the invention makes possible not only a control of the damage that can be generated following an ion implantation, but also an improvement of the removal of the modified dielectric layer 152, by proposing a method that has better etching selectivity between the modified dielectric layer and the non-modified dielectric layer on the one hand, between the modified dielectric layer and the layer of silicon oxide and between the modified dielectric layer and the layer made of a semiconductor material on the other hand.

Advantageously, this invention proposes an infinite selectivity of the modified dielectric layer. As such, this invention allows for better control of the critical dimensions. The method according to this invention furthermore allows for a selective etching of the modified dielectric layer with regard to the other non-modified layers, avoiding any risk of consuming all or a portion of the silicon nitride layer or a silicon oxide layer. In particular the hard mask covers the gate and the insulation trench made of silicon oxide are not altered by the etching of the spacers.

The invention is not limited to only the modes and embodiments described hereinabove, but extends to all the embodiments that fall within the scope of the claims.

The invention claimed is:

1. A method for forming spacers of a gate of a field effect transistor, the gate comprising sides and a top and being located above a layer made of a semiconductor material, the method comprising:
   a step of forming a dielectric layer that covers the gate of the transistor;
   after the step of forming the dielectric layer, at least one step of modifying said dielectric layer by ion implantation at least in portions of the dielectric layer that are located on the top of the gate and to the sides of the gate, the portions being perpendicular to the sides of the gate, while retaining non-modified portions of the dielectric layer covering the sides of the gate, said non-modified portions being at least non-modified over their entire thickness; the ions having a hydrogen base and/or a helium base; and
   at least one step of removing the modified dielectric layer using a selective etching of the modified dielectric layer relative to the layer made of a semiconductor material and relative to the non-modified dielectric layer,
   wherein the dielectric layer is made of a material chosen from among a silicon nitride, SiC, SiCN, and SiCBN, and
   wherein the selective etching of the modified dielectric layer comprises a wet etching based on a solution comprising hydrofluoric acid diluted to x % by weight, with x≤0.2, and having a pH less than or equal to 1.5.

2. The method according to claim 1, wherein the pH is less than or equal to 1.3.

3. The method according to claim 1, where x≤0.15.

4. The method according to claim 1, wherein x is substantially equal to 0.1.

5. The method according to claim 1, wherein the solution is obtained by adding at least one material chosen from among hydrochloric acid, sulfuric acid, and nitric acid.

6. The method according to claim 1, wherein the dielectric layer is a layer of SiN.

7. The method according to claim 1, wherein the selective etching of the modified dielectric layer relative to the non-modified dielectric layer has a selectivity greater than or equal to 11.

8. The method according to claim 1, further comprising, before the step of removing, a step of forming a mask located at the top of the gate, the mask being made from a silicon oxide of $SiO_y$, with y being an integer greater than or equal to 1.

9. The method according to claim 1, further comprising, before the step of removing, a step of forming an insulation trench that extends through the layer of the semiconductor material, the insulation trench being made fro e a silicon oxide of $SiO_y$, with y being an integer greater than or equal to 1.

10. The method according to claim 8, wherein the selective etching of the modified dielectric layer relative to the silicon oxide of $SiO_y$ has a selectivity greater than or equal to 33.

11. The method according to claim 1, further comprising a single step of modification so as to modify the dielectric layer throughout its entire thickness over all of surfaces parallel to a plane of a substrate whereon the gate is disposed and so as to not modify the dielectric layer throughout its entire thickness on surfaces perpendicular to the plane.

12. The method according to claim 1, wherein the step of modifying the dielectric layer by ion implantation comprises exposing the dielectric layer to a plasma and creating an anisotropic ion implantation according to a predetermined direction parallel to the sides of the gate.

13. The method according to claim 12, wherein ions in the plasma have a hydrogen base and/or a helium base.

14. The method according to claim 12, wherein the plasma is obtained by injection into a reactor of gas chosen from among helium, hydrogen, and ammonia, where a corresponding injection flow rate being from 50 sccm to 500 sccm if the gas is helium, being from 10 sccm to 500 sccm if the gas is hydrogen, and being from 10 sccm to 500 sccm if the gas is ammonia.

15. The method according to claim 1, wherein the step of modifying the dielectric layer is performed with a polarization power or a source power ranging from 20V to 500V, with a pressure ranging from 5 mTorr to 100 mTorr, at a temperature ranging from 10° C. to 100° C., and for a duration of a few seconds to several hundred seconds.

16. The method according to claim 1, wherein the transistor is a FDSOI transistor or a FinFET transistor.

* * * * *